United States Patent
Koga et al.

(10) Patent No.: US 10,703,855 B2
(45) Date of Patent: Jul. 7, 2020

(54) RESIN COMPOSITION, PREPREG, METAL-FOIL-CLAD LAMINATE, RESIN SHEET, AND PRINTED CIRCUIT BOARD

(71) Applicant: MITSUBISHI GAS CHEMICAL COMPANY, INC., Tokyo (JP)

(72) Inventors: Shota Koga, Tokyo (JP); Daisuke Ueyama, Niigata (JP); Kentaro Takano, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 16/079,353

(22) PCT Filed: Sep. 1, 2017

(86) PCT No.: PCT/JP2017/031512
§ 371 (c)(1),
(2) Date: Aug. 23, 2018

(87) PCT Pub. No.: WO2018/047724
PCT Pub. Date: Mar. 15, 2018

(65) Prior Publication Data
US 2019/0023832 A1 Jan. 24, 2019

(30) Foreign Application Priority Data

Sep. 12, 2016 (JP) .................. 2016-177833

(51) Int. Cl.
| | | |
|---|---|---|
| C08G 59/06 | (2006.01) | |
| C08J 5/24 | (2006.01) | |
| C08L 63/00 | (2006.01) | |
| B32B 15/092 | (2006.01) | |
| C08G 59/40 | (2006.01) | |
| C08G 59/32 | (2006.01) | |
| H05K 1/03 | (2006.01) | |
| C08K 5/315 | (2006.01) | |
| B32B 15/08 | (2006.01) | |
| C08K 5/29 | (2006.01) | |
| H05K 3/02 | (2006.01) | |

(52) U.S. Cl.
CPC .............. *C08G 59/06* (2013.01); *B32B 15/08* (2013.01); *B32B 15/092* (2013.01); *C08G 59/063* (2013.01); *C08G 59/3218* (2013.01); *C08G 59/4028* (2013.01); *C08J 5/24* (2013.01); *C08K 5/29* (2013.01); *C08K 5/315* (2013.01); *C08L 63/00* (2013.01); *H05K 1/036* (2013.01); *H05K 1/0353* (2013.01); *C08J 2363/02* (2013.01); *H05K 1/0326* (2013.01); *H05K 1/0346* (2013.01); *H05K 3/022* (2013.01); *H05K 2201/0355* (2013.01)

(58) Field of Classification Search
None
See application file for complete search history.

(56) References Cited

U.S. PATENT DOCUMENTS

| | | |
|---|---|---|
| 2014/0377565 A1 | 12/2014 | Kobayashi et al. |
| 2015/0034369 A1 | 2/2015 | Kashima et al. |
| 2016/0125972 A1 | 5/2016 | Arii et al. |

FOREIGN PATENT DOCUMENTS

| | | |
|---|---|---|
| CN | 103649219 A | 3/2014 |
| EP | 2774938 A1 | 9/2014 |
| JP | H04-328115 A | 11/1992 |
| JP | 2003-073318 A | 3/2003 |
| JP | 2003-252953 A | 9/2003 |
| JP | 2004-331680 A | 11/2004 |
| JP | 2012-251048 A | 12/2012 |
| JP | 2013-209503 A | 10/2013 |
| JP | 2015-003972 A | 1/2015 |
| JP | 2015-117311 A | 6/2015 |
| WO | 2013-0065694 A | 5/2013 |
| WO | 2014-0065152 A | 5/2014 |
| WO | 2014-0203866 A | 12/2014 |
| WO | 2017-0038979 A | 3/2017 |

OTHER PUBLICATIONS

International Search Report dated Oct. 3, 2017 in the International Application No. PCT/JP2017-031512, with English translation.
Written Opinion dated Oct. 3, 2017 in the International Application No. PCT/JP2017-031512.
Decision to Grant a Patent in Japanese Application No. 2017-564518 dated May 7, 2018.
Claims in Japanese Application No. 2017-564518 filed on Apr. 13, 2018 as allowed in the above-noted Decision to Grant a Patent.
Japanese Office Action in Japanese Application No. 2017-564518 dated Feb. 15, 2018.

*Primary Examiner* — Megan McCulley
(74) *Attorney, Agent, or Firm* — Greenblum & Bernstein, P.L.C.

(57) ABSTRACT

A resin composition containing:
an epoxy resin (A) represented by the following formula (1); and
a cyanate compound (B),

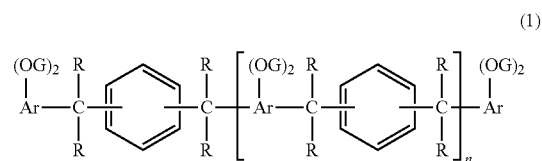

(1)

wherein Ar represents a polycyclic aromatic group, R represents a hydrogen atom or a methyl group, G represents a glycidyl group, and n represents an integer of 0 to 15.

19 Claims, No Drawings

RESIN COMPOSITION, PREPREG, METAL-FOIL-CLAD LAMINATE, RESIN SHEET, AND PRINTED CIRCUIT BOARD

TECHNICAL FIELD

The present invention relates to a resin composition, a prepreg, a metal foil-clad laminate, a resin sheet and a printed circuit board.

BACKGROUND ART

In recent years, higher integration and miniaturization of semiconductors widely used in electronic equipment, communication instruments, personal computers, and the like have accelerated increasingly. With this, various characteristics required for laminates for semiconductor packages used in printed circuit boards have become increasingly strict. Examples of the required characteristics include characteristics such as low water absorbency, moisture absorption heat resistance, flame retardancy, a low dielectric constant, a low dielectric loss tangent, a low thermal expansion coefficient, heat resistance, chemical resistance, and high plating peel strength. But, these required characteristics have not always been satisfied so far.

Conventionally, as materials for printed circuit boards having excellent heat resistance and electrical characteristics, cyanate compounds are known, and in recent years, resin compositions using cyanate compounds in combination with epoxy resins, bismaleimide compounds, and the like have been widely used for materials for highly functional printed circuit boards such as for semiconductor plastic packages, and the like.

For example, in Patent Literatures 1 and 2, resin compositions, which contains a cyanate compound and an epoxy resin that have excellent characteristics such as adhesiveness, low water absorbency, moisture absorption heat resistance, and insulation reliability, are proposed.

CITATION LIST

Patent Literature

Patent Literature 1: International Publication No. WO 2013/065694
Patent Literature 2: International Publication No. WO 2014/203866

SUMMARY OF INVENTION

Technical Problem

The resin compositions described in Patent Literatures 1 to 2 can be considered to have good physical properties for adhesiveness, low water absorbency, moisture absorption heat resistance, and insulation reliability but cannot be considered to have a sufficient physical property balance from the viewpoint of copper foil peel strength, flexural strength, a flexural modulus, a water absorption rate, a linear thermal expansion coefficient, a weight loss on heating, and thermal conductivity.

The present invention has been made in view of the above problem, and an object of the present invention is to provide a resin composition, a prepreg, a metal foil-clad laminate, a resin sheet, and a printed circuit board, that exhibit excellent copper foil peel strength, excellent flexural strength, an excellent flexural modulus, an excellent water absorption rate, an excellent linear thermal expansion coefficient, an excellent weight loss on heating, and excellent thermal conductivity.

Solution to Problem

The present inventors have diligently studied in order to solve the above problem. As a result, the present inventors have found that the above problem can be solved by using a cyanate compound and an epoxy resin having a particular structure in combination, leading to completion of the present invention.

Specifically, the present invention includes the following aspects.

[1]

A resin composition comprising:

an epoxy resin (A) represented by the following formula (1); and a cyanate compound (B),

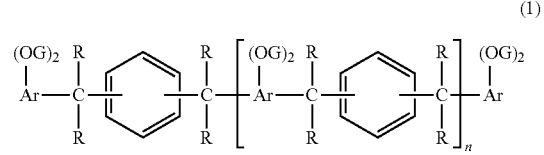

wherein Ar represents a polycyclic aromatic group, R each independently represents a hydrogen atom or a methyl group, G represents a glycidyl group, and n represents an integer of 0 to 15.

[2]

The resin composition according to [1], wherein in the formula (1), the polycyclic aromatic groups are each independently a biphenyl group, an acenaphthene group, a fluorene group, a dibenzofuran group, an anthracene group, a phenanthrene group, or a group derived from bisphenols.

[3]

The resin composition according to [1] or [2], wherein the epoxy resin (A) is represented by the following formula (1-1):

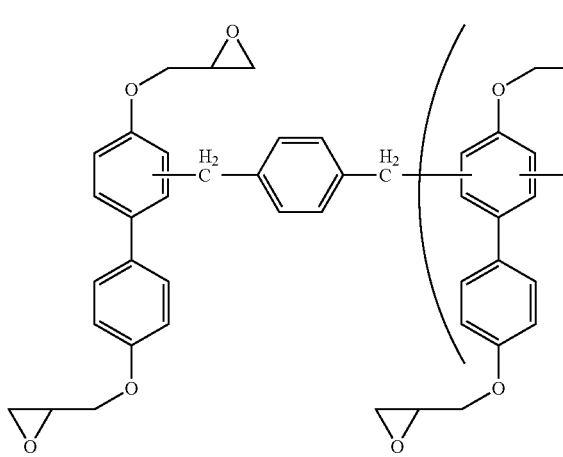
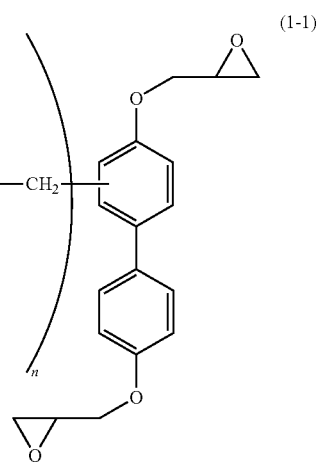

(1-1)

wherein n represents an integer of 0 to 15.

[4]
The resin composition according to any of [1] to [3], wherein a content of the epoxy resin (A) is 1 to 90 parts by mass based on 100 parts by mass of resin solid component.

[5]
The resin composition according to any of [1] to [4], further comprising a filler (C).

[6]
The resin composition according to any of [1] to [5], further comprising one or more selected from a group consisting of an epoxy resin other than the epoxy resin (A) represented by the formula (1), a maleimide compound, a phenolic resin, an oxetane resin, a benzoxazine compound, and a compound having a polymerizable unsaturated group.

[7]
The resin composition according to [5] or [6], wherein a content of the filler (C) is 50 to 1600 parts by mass based on 100 parts by mass of the resin solid component.

[8]
A prepreg comprising:
a base material; and
the resin composition according to any of [1] to [7], with which the base material is impregnated or coated.

[9]
A metal foil-clad laminate comprising:
at least one or more of the prepregs according to [8] laminated; and
a metal foil disposed on one surface or both surfaces of the prepreg.

[10]
A resin sheet comprising:
a support; and
the resin composition according to any of [1] to [7], disposed on a surface of the support.

[11]
A printed circuit board comprising:
an insulating layer; and
a conductor layer formed on a surface of the insulating layer, wherein
the insulating layer comprises the resin composition according to any of [1] to [7].

Advantageous Effect of Invention

According to the present invention, a resin composition, a prepreg, a metal foil-clad laminate, a resin sheet, and a printed circuit board, that exhibit excellent copper foil peel strength, excellent flexural strength, an excellent flexural modulus, an excellent water absorption rate, an excellent linear thermal expansion coefficient, an excellent weight loss on heating, and excellent thermal conductivity can be provided.

DESCRIPTION OF EMBODIMENT

An embodiment for carrying out the present invention (hereinafter referred to as "the present embodiment") will be described in detail below, but the present invention is not limited to this, and various modifications can be made without departing from the spirit thereof.

A resin composition in the present embodiment comprises: an epoxy resin (A) represented by the following formula (1); and a cyanate compound (B). The resin composition in the present embodiment is configured in this manner and therefore can exhibit excellent copper foil peel strength, excellent flexural strength, an excellent flexural modulus, an excellent water absorption rate, an excellent linear thermal expansion coefficient, an excellent weight loss on heating, and excellent thermal conductivity.

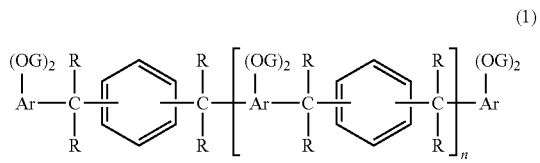

(1)

wherein Ar represents a polycyclic aromatic group, R each independently represents a hydrogen atom or a methyl group, G represents a glycidyl group, and n represents an integer of 0 to 15.

Components constituting the resin composition in the present embodiment will be described below.

[Epoxy Resin (A)]

The epoxy resin (A) in the present embodiment is represented by the above formula (1).

The polycyclic aromatic groups in formula (1) are not particularly limited but are each independently preferably a biphenyl group, an acenaphthene group, a fluorene group, a dibenzofuran group, an anthracene group, a phenanthrene group, or a group derived from bisphenols. The group derived from bisphenols is not particularly limited. Examples thereof include groups derived from bisphenols such as bisphenol F, bisphenol A, bisphenol S, and bisphenol fluorene. In the present embodiment, from the viewpoint of making better the physical property balance of copper foil peel strength, flexural strength, a flexural modulus, a water absorption rate, a linear thermal expansion coefficient, a weight loss on heating, and thermal conductivity, the polycyclic aromatic groups in formula (1) are more preferably biphenyl groups.

In addition, n in formula (1) is 15 or less, preferably 10 or less. When n is larger than 15, the softening point of the resin increases, which may compromise workability.

In the present embodiment, from the viewpoint of making better the physical property balance of copper foil peel strength, flexural strength, a flexural modulus, a water absorption rate, a linear thermal expansion coefficient, a weight loss on heating, and thermal conductivity, the epoxy resin (A) is preferably represented by the following formula (1-1):

wise noted, and "100 parts by mass of resin solid component" refers to the total of the components in the resin composition in the present embodiment excluding the solvent and the filler being 100 parts by mass.

The method for producing the epoxy resin (A) in the present embodiment is not particularly limited, and known methods can be used. For example, the epoxy resin (A) in the present embodiment can be produced as follows.

Examples of the method for producing the epoxy resin (A) in the present embodiment include a method of reacting a polycyclic aromatic dihydroxy compound and 0.1 to 0.9 mol of a condensing agent represented by the following formula (1A) based on 1 mol of the polycyclic aromatic dihydroxy compound to produce a polyvalent hydroxy compound represented by the following formula (1B), and then reacting this polyvalent hydroxy compound with epichlorohydrin.

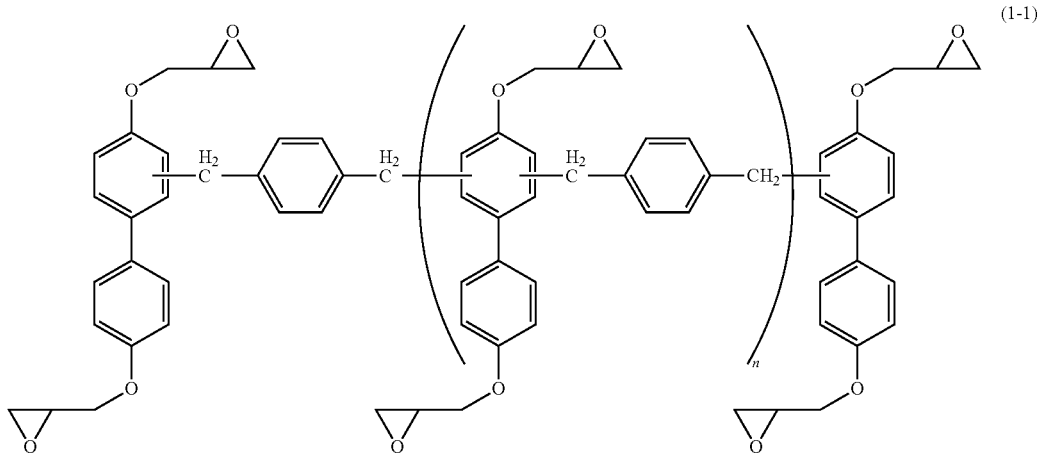

(1-1)

wherein n represents an integer of 0 to 15.

One of the above-described epoxy resin (A) can also be used alone, or two or more of the above-described epoxy resins (A) can also be used in combination. In addition, for the epoxy resin (A), commercial products can also be used. Examples thereof include, but are not limited to, "GK-3007-50D" manufactured by NIPPON STEEL & SUMIKIN CHEMICAL CO., LTD.

The content of the epoxy resin (A) in the present embodiment can be appropriately set according to the desired characteristics and is not particularly limited but is preferably 1 to 90 parts by mass, more preferably 30 to 70 parts by mass, and further preferably 40 to 60 parts by mass, based on 100 parts by mass of resin solid component from the viewpoint of making better the physical property balance of copper foil peel strength, flexural strength, a flexural modulus, a water absorption rate, a linear thermal expansion coefficient, a weight loss on heating, and thermal conductivity.

In the present embodiment, the "resin solid component" refers to components in the resin composition in the present embodiment excluding a solvent and a filler unless other-

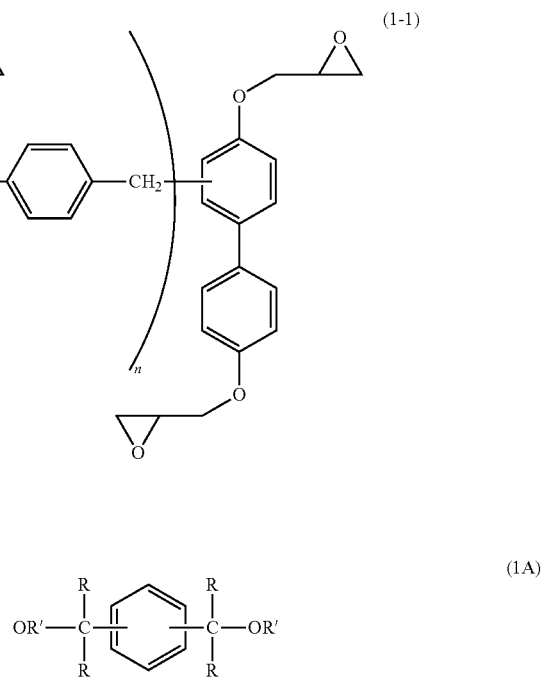

wherein R represents a hydrogen atom or a methyl group, and R' represents a hydrogen atom or a hydrocarbon group having 1 to 4 carbon atoms.

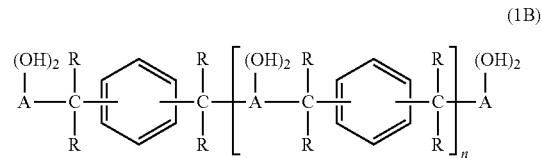

wherein A represents a polycyclic aromatic group, R represents a hydrogen atom or a methyl group, and n represents an integer of 0 to 15.

The polyvalent hydroxy compound represented by the above general formula (1B) that is a raw material of the polyfunctional epoxy resin represented by formula (1) can be obtained, for example, by reacting a polycyclic aromatic diol and the condensing agent represented by the above general formula (1A).

Examples of the polycyclic aromatic diol include, but are not limited to, dihydroxy compounds such as naphthalene, biphenyl, acenaphthene, fluorene, dibenzofuran, anthracene, and phenanthrene, and bisphenols such as bisphenol F, bisphenol A, bisphenol S, and bisphenol fluorene. Dihydroxy compounds that are naphthalene and biphenyl are preferred. Specific examples are, but are not limited to, 1,4-naphthalenediol, 1,5-naphthalenediol, 1,6-naphthalenediol, 1,7-naphthalenediol, 2,6-naphthalenediol, 2,7-naphthalenediol, 4,4-dihydroxybiphenyl, 2,2-dihydroxybiphenyl, and the like.

The condensing agent represented by general formula (1A) may be any of the o-form, the m-form, and the p-form but is preferably the m-form or the p-form. Specific examples include p-xylylene glycol, α,α'-dimethoxy-p-xylene, α,α'-diethoxy-p-xylene, α,α'-di-n-propoxy-p-xylene, α,α'-diisopropoxy-p-xylene, 1,4-di(2-hydroxy-2-propyl) benzene, 1,4-di(2-methoxy-2-propyl)benzene, 1,4-di(2-n-propoxy-2-propyl)benzene, and 1,4-di(2-isopropoxy-2-propyl)benzene.

For the molar ratio between the above polycyclic aromatic diol and the condensing agent when both are reacted, the condensing agent is preferably 1 mol or less, more preferably in the range of 0.1 to 0.9, based on 1 mol of the polycyclic aromatic diol. When the condensing agent is 0.1 mol or more, the amount of the unreacted polycyclic aromatic diol can be reduced, and the heat resistance of the resin cured product when the epoxy resin is formed tends to be sufficiently ensured. In addition, when the condensing agent is 0.9 mol or less, the softening point of the resin is prevented from being too high, and workability can be sufficiently ensured. In addition, in general formula (1B), n is preferably 15 or less.

This reaction, in which the polycyclic aromatic diol and the condensing agent are reacted to produce the polyvalent hydroxy compound, can be performed in the presence of an acid catalyst. This acid catalyst can be appropriately selected from well-known inorganic acids and organic acids. Examples of this acid catalyst include, but are not limited to, mineral acids such as hydrochloric acid, phosphoric acid, and sulfuric acid, organic acids such as formic acid, oxalic acid, trifluoroacetic acid, and p-toluenesulfonic acid, Lewis acids such as zinc chloride, aluminum chloride, and iron chloride, or solid acids.

This reaction is usually performed at 10 to 250° C. for 1 to 20 hours. In addition, in the reaction, an alcohol such as methanol, ethanol, propanol, butanol, ethylene glycol, diethylene glycol, methyl cellosolve, or ethyl cellosolve, an aromatic hydrocarbon such as benzene, toluene, chlorobenzene, or dichlorobenzene, or the like can also be used as a solvent.

The epoxy resin (A) can be produced by reacting the polyvalent hydroxy compound represented by the above general formula (1B) with epichlorohydrin. This reaction can be performed similarly to a usual epoxidation reaction. Examples thereof include a method of dissolving the polyvalent hydroxy compound represented by the above general formula (1B) in excess epichlorohydrin and then reacting the solution in the presence of an alkali metal hydroxide such as sodium hydroxide or potassium hydroxide in the range of 50 to 150° C., preferably 60 to 120° C., for about 1 to 10 hours. The amount of epichlorohydrin used at this time is in the range of 2 to 15-fold mol, preferably 2 to 10-fold mol, based on the number of moles of hydroxy groups in the polyvalent hydroxy compound. In addition, the amount of the alkali metal hydroxide used is in the range of 0.8 to 1.2-fold mol, preferably 0.9 to 1.1-fold mol, based on the number of moles of hydroxy groups in the polyvalent hydroxy compound.

After completion of the reaction, the excess epichlorohydrin is distilled off by distillation, the residue is dissolved in a solvent such as toluene or methyl isobutyl ketone followed by filtration and water washing to remove the inorganic salt, and then the solvent is distilled off, and thus the target epoxy resin (A) can be obtained.

[Cyanate Compound (B)]

The cyanate compound (B) is not particularly limited as long as it is a compound having in the molecule an aromatic moiety substituted by at least one cyanato group (cyanate group). The resin composition using the cyanate compound (B) has characteristics excellent in glass transition temperature, low thermal expansion properties, plating adhesiveness, and the like when formed into a cured product.

Examples of the cyanate compound (B) include, but are not limited to, one represented by the following formula (2):

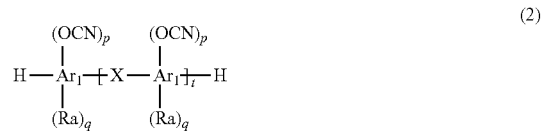

wherein $Ar_1$ represents a benzene ring, a naphthalene ring, or two benzene rings bonded to each other via a single bond. When there are a plurality of $Ar_1$, $Ar_1$ may be the same as or different from each other. Ra each independently represents a hydrogen atom, an alkyl group having 1 to 6 carbon atoms, an aryl group having 6 to 12 carbon atoms, an alkoxyl group having 1 to 4 carbon atoms, or a group in which an alkyl group having 1 to 6 carbon atoms and an aryl group having 6 to 12 carbon atoms are bonded to each other. The aromatic ring for Ra may have a substituent, and any position can be selected for the substituents in $Ar_1$ and Ra. p represents the number of cyanato groups bonded to $Ar_1$ and is each independently an integer of 1 to 3. q represents the number of Ra bonded to $Ar_1$ and is 4-p when $Ar_1$ is a benzene ring, 6-p when $Ar_1$ is a naphthalene ring, and 8-p when $Ar_1$ is two benzene rings bonded to each other via a single bond. t represents the average number of repetitions and is an integer of 0 to 50, and the cyanate compound may be a mixture of compounds having different t. X represents any of a single bond, a divalent organic group having 1 to 50 carbon atoms (a hydrogen atom may be replaced by a heteroatom), a divalent organic group having 1 to 10 nitrogen atoms (for example, —N—R—N— (wherein R represents an organic group)), a carbonyl group (—CO—), a carboxy group (—C(=O)O—), a carbonyl dioxide group (—OC(=O)O—), a sulfonyl group (—SO$_2$—), a divalent sulfur atom, or a divalent oxygen atom, and X is each independently as defined above when there are a plurality of X.

The alkyl group for Ra in the above formula (2) may have either of a linear or branched chain structure and a cyclic structure (for example, a cycloalkyl group).

In addition, a hydrogen atom in the alkyl group and the aryl group for Ra in general formula (2) may be replaced by a halogen atom such as a fluorine atom or a chlorine atom, an alkoxyl group such as a methoxy group or a phenoxy group, a cyano group, or the like.

Specific examples of the alkyl group include, but are not limited to, a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

Specific examples of the aryl group include, but are not limited to, a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluorophenyl group, a methoxyphenyl group, and an o-, m-, or p-tolyl group.

Examples of the alkoxyl group include, but are not limited to, a methoxy group, an ethoxy group, a propoxy group, an isopropoxy group, a n-butoxy group, an isobutoxy group, and a tert-butoxy group.

Specific examples of the divalent organic group having 1 to 50 carbon atoms for X in the above formula (2) include, but are not limited to, a methylene group, an ethylene group, a trimethylene group, a cyclopentylene group, a cyclohexylene group, a trimethylcyclohexylene group, a biphenylylmethylene group, a dimethylmethylene-phenylene-dimethylmethylene group, a fluorenediyl group, and a phthalidediyl group. A hydrogen atom in the divalent organic group may be replaced by a halogen atom such as a fluorine atom or a chlorine atom, an alkoxyl group such as a methoxy group or a phenoxy group, a cyano group, or the like.

Examples of the divalent organic group having 1 to 10 nitrogen atoms for X in the above formula (2) include, but are not limited to, an imino group and a polyimide group.

In addition, examples of the organic group of X in the above formula (2) include one having a structure represented by the following formula (3) or the following formula (4).

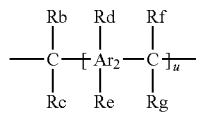

(3)

wherein $Ar_2$ represents a benzenetetrayl group, a naphthalenetetrayl group, or a biphenyltetrayl group, and may be the same as or different from each other when u is 2 or more; Rb, Rc, Rf, and Rg each independently represent a hydrogen atom, an alkyl group having 1 to 6 carbon atoms, an aryl group having 6 to 12 carbon atoms, a trifluoromethyl group, or an aryl group having at least one phenolic hydroxy group; Rd and Re are each independently selected from any one of a hydrogen atom, an alkyl group having 1 to 6 carbon atoms, an aryl group having 6 to 12 carbon atoms, an alkoxyl group having 1 to 4 carbon atoms, or a hydroxy group; and u represents an integer of 0 to 5.

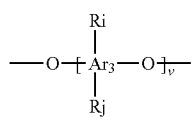

(4)

wherein $Ar_a$ represents a benzenetetrayl group, a naphthalenetetrayl group, or a biphenyltetrayl group, and may be the same as or different from each other when v is 2 or more; Ri and Rj each independently represent a hydrogen atom, an alkyl group having 1 to 6 carbon atoms, an aryl group having 6 to 12 carbon atoms, a benzyl group, an alkoxyl group having 1 to 4 carbon atoms, a hydroxy group, a trifluoromethyl group, or an aryl group substituted by at least one cyanato group; and v represents an integer of 0 to 5, and the cyanate compound may be a mixture of compounds having different v.

Further, examples of X in general formula (2) include divalent groups represented by the following formulas:

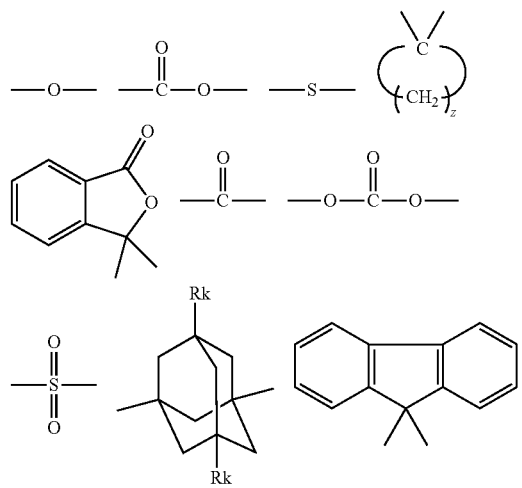

wherein z represents an integer of 4 to 7; and Rk each independently represents a hydrogen atom or an alkyl group having 1 to 6 carbon atoms.

Specific examples of $Ar_e$ in general formula (3) and $Ar_3$ in general formula (4) include a benzenetetrayl group to which two carbon atoms shown in general formula (3) or two oxygen atoms shown in general formula (4) are bonded at positions 1 and 4 or positions 1 and 3, a biphenyltetrayl group to which the above two carbon atoms or two oxygen atoms are bonded at positions 4 and 4', positions 2 and 4', positions 2 and 2', positions 2 and 3', positions 3 and 3', or positions 3 and 4', and a naphthalenetetrayl group to which the above two carbon atoms or two oxygen atoms are bonded at positions 2 and 6, positions 1 and 5, positions 1 and 6, positions 1 and 8, positions 1 and 3, positions 1 and 4, or positions 2 and 7.

The alkyl group and the aryl group for Rb, Rc, Rd, Re, Rf, and Rg in general formula (3) and Ri and Rj in general formula (4) have the same meanings as the alkyl group and the aryl group for Ra in the above general formula (2).

Specific examples of the cyanato-substituted aromatic compound represented by the above general formula (2) include, but are not limited to, cyanatobenzene, 1-cyanato-2-, 1-cyanato-3-, or 1-cyanato-4-methylbenzene, 1-cyanato-2-, 1-cyanato-3-, or 1-cyanato-4-methoxybenzene, 1-cyanato-2,3-, 1-cyanato-2,4-, 1-cyanato-2,5-, 1-cyanato-2,6-, 1-cyanato-3,4-, or 1-cyanato-3,5-dimethylbenzene, cyanatoethylbenzene, cyanatobutylbenzene, cyanatooctylbenzene, cyanatononylbenzene, 2-(4-cyanaphenyl)-2-phenylpropane (a cyanate of 4-α-cumylphenol), 1-cyanato-4-cyclohexylbenzene, 1-cyanato-4-vinylbenzene, 1-cyanato-2- or 1-cyanato-3-chlorobenzene, 1-cyanato-2,6-dichlorobenzene, 1-cyanato-2-methyl-3-chlorobenzene, cyanatonitrobenzene, 1-cyanato-4-nitro-2-ethylbenzene, 1-cyanato-2-methoxy-4-allylbenzene (a cyanate of eugenol), methyl(4-cyanatophenyl)sulfide, 1-cyanato-3-trifluoromethylbenzene, 4-cyanatobiphenyl, 1-cyanato-2- or 1-cyanato-4-acetylbenzene, 4-cyanatobenzaldehyde, methyl 4-cyanatobenzoate ester, phenyl 4-cyanatobenzoate ester, 1-cyanato-4-acetaminobenzene, 4-cyanatobenzophenone, 1-cyanato-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-dimethylbenzene, 1,3-dicyanato-2,4,6-trimethylbenzene, 1,3-dicyanato-5-methylbenzene, 1-cyanato- or 2-cyanatonaphthalene, 1-cyanato4-methoxynaphthalene, 2-cyanato-6-methylnaphthalene, 2-cyanato-7-methoxynaphthalene, 2,2'-dicyanato-1,1'-binaphthyl, 1,3-, 1,4-, 1,5-, 1,6-, 1,7-, 2,3-, 2,6-, or 2,7-dicyanatonaphthalene, 2,2'- or 4,4'-dicyanatobiphenyl, 4,4'-dicyanatooctafluorobiphenyl, 2,4'- or 4,4'-dicyanatodiphenylmethane, bis(4-cyanato-3,5-dimethylphenyl)methane, 1,1-bis(4-cyanatophenyl)ethane, 1,1-bis (4-cyanatophenyl)propane, 2,2-bis(4-cyanatophenyl)propane, 2,2-bis(4-cyanato-3-methylphenyl)propane, 2,2-bis(2-cyanato-5-biphenylyl)propane, 2,2-bis(4-cyanatophenyl) hexafluoropropane, 2,2-bis(4-cyanato-3,5-dimethylphenyl) propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl)butane, 2,2-bis (4-cyanatophenyl)pentane, 2,2-bis(4-cyanatophenyl) hexane, 2,2-bis(4-cyanatophenyl)-3-methylbutane, 2,2-bis (4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl)cyclopentane, 1,1-bis(4-cyanatopylenyl)cyclohexane, 2,2-bis(4-cyanato-3-isopropylphenyl)propane, 1,1-bis(3-cyclohexyl-4-cyanatophenyl)cyclohexane, bis(4-cyanatophenyl) diphenylmethane, bis(4-cyanatophenyl)-2,2-dichloroethylene, 1,3-bis[2-(4-cyanatophenyl)-2-propyl] benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propen-1-one, bis (4-cyanatophenyl) ether, bis(4-cyanatophenyl) sulfide, bis (4-cyanatophenyl) sulfone, 4-cyanatobenzoic acid-4-cyanatophenyl ester (4-cyanatophenyl-4-cyanatobenzoate), bis-(4-cyanatophenyl) carbonate, 1,3-bis(4-cyanatophenyl) adamantane, 1,3-bis(4-cyanatophenyl)-5,7-dimethyladamantane, 3,3-bis(4-cyanatophenyl)isobenzofuran-1(3H)-one (a cyanate of phenolphthalein), 3,3-bis(4-cyanato-3-methylphenyl)isobenzofuran-1(3H)-one (a cyanate of o-cresolphthalein), 9,9'-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1-tris(4-cyanatophenyl)ethane, 1,1,3-tris(4-cyanatophenyl) propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4'-oxydiphthalimide, bis(N-3-cyanato-4-methylphenyl)-4,4'-oxydiphthalimide, bis(N-4-cyanatophenyl)-4,4'-oxydiphthalimide, bis(N-4-cyanato-2-methylphenyl)-4,4'-(hexafluoroisopropylidene) diphthalimide, tris(3,5-dimethyl-4-cyanatobenzyl) isocyanurate, 2-phenyl-3,3-bis(4-cyanatophenyl)phthalimidine, 2-(4-methylphenyl)-3,3-bis(4-cyanatophenyl)phthalimidine, 2-phenyl-3,3-bis(4-cyanato-3-methylphenyl) phthalimidine, 1-methyl-3,3-bis(4-cyanatophenyl)indolin-2-one, and 2-phenyl-3,3-bis(4-cyanatophenyl)indolin-2-one.

In addition, other specific examples of the compound represented by the above general formula (2) include, but are not limited to, those obtained by cyanation of phenolic resins such as phenol novolac resins and cresol novolac resins (those obtained by reacting a phenol, an alkyl-substituted phenol, or a halogen-substituted phenol and a formaldehyde compound such as formalin or paraformaldehyde in an acidic solution by a known method), trisphenol novolac resins (those obtained by reacting hydroxybenzaldehyde and a phenol in the presence of an acidic catalyst), fluorene novolac resins (those obtained by reacting a fluorenone compound and a 9,9-bis(hydroxyaryl)fluorene in the presence of an acidic catalyst), phenol aralkyl resins, cresol aralkyl resins, naphthol aralkyl resins, and biphenyl aralkyl resins (those obtained by reacting a bishalogenomethyl compound as represented by $Ar_4$—$(CH_2Y)_2$ ($Ar_4$ represents a phenyl group, and Y represents a halogen atom; and the same applies below in this paragraph) and a phenol compound with an acidic catalyst or without a catalyst by a known method, those obtained by reacting a bis(alkoxymethyl) compound as represented by $Ar_4$—$(CH_2OR)_2$ and a phenol compound in the presence of an acidic catalyst by a known method, or those obtained by reacting a bis(hydroxymethyl) compound as represented by $Ar_4$—$(CH_2OH)_2$ and a phenol compound in the presence of an acidic catalyst by a known method, or those obtained by polycondensing an aromatic aldehyde compound, an aralkyl compound, and a phenol compound by a known method), phenol-modified xylene formaldehyde resins (those obtained by reacting a xylene formaldehyde resin and a phenol compound in the presence of an acidic catalyst by a known method), modified naphthalene formaldehyde resins (those obtained by reacting a naphthalene formaldehyde resin and a hydroxy-substituted aromatic compound in the presence of an acidic catalyst by a known method), and phenol-modified dicyclopentadiene resins, and phenolic resins having a polynaphthylene ether structure (those obtained by subjecting a polyvalent hydroxynaphthalene compound having two or more phenolic hydroxy groups in one molecule to dehydration condensation in the presence of a basic catalyst by a known method) by a method similar to the above, and prepolymers thereof.

One of the above-described cyanate compound (B) can be used alone, or two or more of the above-described cyanate compounds (B) can be mixed and used.

Among these, phenol novolac-based cyanate compounds, naphthol aralkyl-based cyanate compounds, biphenyl aralkyl-based cyanate compounds, naphthylene ether-based cyanate compounds, xylene resin-based cyanate compounds, and adamantane skeleton-based cyanate compounds are preferred, and naphthol aralkyl-based cyanate compounds are particularly preferred.

Specific examples of the naphthol aralkyl-based cyanates include a naphthol aralkyl-based cyanate represented by formula (5). By using such a naphthol aralkyl-based cyanate, a cured product having a lower thermal expansion coefficient tends to be obtained.

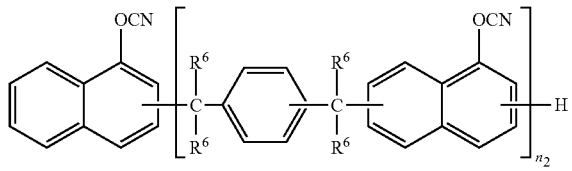

(5)

wherein $R^6$ each independently represents a hydrogen atom or a methyl group, and of these, a hydrogen atom is preferred; $n_2$ represents an integer of 1 or more; and the upper limit value of $n_2$ is usually 10, preferably 6.

The content of the cyanate compound (B) can be appropriately set according to the desired characteristics and is not particularly limited but is preferably 1 to 90 parts by mass, more preferably 30 to 70 parts by mass, and further preferably 40 to 60 parts by mass, based on 100 parts by mass of the resin solid component from the viewpoint of obtaining a cured product having a lower thermal expansion coefficient.

[Filler (C)]

The resin composition in the present embodiment preferably further contains the filler (C) from the viewpoint of thermal expansion characteristics, dimensional stability, flame retardancy, thermal conductivity, dielectric characteristics, and the like. As the filler (C), known ones can be appropriately used, and the type of the filler (C) is not particularly limited. Particularly, fillers generally used in laminate applications can be preferably used as the filler (C). Specific examples of the filler (C) include inorganic fillers such as silicas such as natural silica, fused silica, synthetic silica, amorphous silica, AEROSIL, and hollow silica, oxides such as white carbon, titanium white, zinc oxide, magnesium oxide, and zirconium oxide, boron nitride, aggregated boron nitride, silicon nitride, aluminum nitride, barium sulfate, metal hydrates such as aluminum hydroxide, heat-treated products of aluminum hydroxide (products obtained by heat-treating aluminum hydroxide to decrease some of the water of crystallization), boehmite, and magnesium hydroxide, molybdenum compounds such as molybdenum oxide and zinc molybdate, zinc borate, zinc stannate, alumina, clay, kaolin, talc, calcined clay, calcined kaolin, calcined talc, mica, E-glass, A-glass, NE-glass, C-glass, L-glass, D-glass, S-glass, M-glass G20, glass short fibers (including fine powders of glass such as E glass, T glass, D glass, S glass, and Q glass), hollow glass, and spherical glass as well as organic fillers such as rubber powders such as styrene-based rubber powders, butadiene-based rubber powders, and acrylic rubber powders, core-shell-based rubber powders, and silicone resin powders, silicone rubber powders, and silicone composite powders. One of these fillers can be used alone, or two or more of these fillers can be used in combination.

Among these, one or two or more selected from the group consisting of silica, aluminum hydroxide, boehmite, magnesium oxide, and magnesium hydroxide are preferred. By using these fillers, the characteristics, such as thermal expansion characteristics, dimensional stability, and flame retardancy, of the resin composition tend to improve more.

The content of the filler (C) in the resin composition in the present embodiment can be appropriately set according to the desired characteristics and is not particularly limited, but is preferably 50 to 1600 parts by mass, more preferably 50 to 750 parts by mass, further preferably 50 to 300 parts by mass, and particularly preferably 50 to 200 parts by mass, when the content of the resin solid component is 100 parts by mass, from the viewpoint of the moldability of the resin composition.

Here, when the filler (C) is contained in the resin composition, a silane coupling agent and a wetting and dispersing agent are preferably used in combination. As the silane coupling agent, those generally used for surface treatment of inorganic matter can be preferably used, and the type of the silane coupling agent is not particularly limited. Specific examples of the silane coupling agent include, but are not limited to, aminosilane-based silane coupling agents such as γ-aminopropyltriethoxysilane and N-β-(aminoethyl)-γ-aminopropyltrimethoxysilane, epoxysilane-based silane coupling agents such as γ-glycidoxypropyltrimethoxysilane and β-(3,4-epoxycyclohexyl)ethyltrimethoxysilane, vinylsilane-based silane coupling agents such as γ-methacryloxypropyltrimethoxysilane and vinyl-tri(β-methoxyethoxy)silane, cationic silane-based silane coupling agents such as N-β-(N-vinylbenzylaminoethyl)-γ-aminopropyltrimethoxysilane hydrochloride, and phenylsilane-based silane coupling agents. One of these silane coupling agents can be used alone, or two or more of these silane coupling agents can be used in combination. In addition, as the wetting and dispersing agent, those generally used for paints can be preferably used, and the type of the wetting and dispersing agent is not particularly limited. As the wetting and dispersing agent, preferably, copolymer-based wetting and dispersing agents are used, and the wetting and dispersing agent may be a commercial product. Specific examples of the commercial product include, but are not limited to, Disperbyk-110, 111, 161, and 180, BYK-W996, BYK-W9010, BYK-W903, and BYK-W940 manufactured by BYK Japan KK. One of these wetting and dispersing agents can be used alone, or two or more of these wetting and dispersing agents can be used in combination.

[Other Components]

Further, the resin composition in the present embodiment may further contain an epoxy resin other than the epoxy resin (A) represented by the above formula (1) (hereinafter referred to as "another epoxy resin"), a maleimide compound, a phenolic resin, an oxetane resin, a benzoxazine compound, a compound having a polymerizable unsaturated group, and the like in a range in which the expected characteristics are not impaired. By using these in combination, the desired characteristics, such as flame retardancy and low dielectric properties, of a cured product obtained by curing the resin composition tend to improve.

(Another Epoxy Resin)

As the another epoxy resin, known ones can be appropriately used as long as they are epoxy resins that are not represented by formula (1) and that have two or more epoxy groups in one molecule. The type of the another epoxy resin is not particularly limited. Specific examples include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, glycidyl ester-based epoxy resins, aralkyl novolac-based epoxy resins, biphenyl aralkyl-based epoxy resins, naphthylene ether-based epoxy resins, cresol novolac-based epoxy resins, polyfunctional phenol-based epoxy resins, naphthalene-based epoxy resins, anthracene-based epoxy resins, naphthalene skeleton-modified novolac-based epoxy resins, phenol aralkyl-based epoxy resins, naphthol aralkyl-based epoxy resins, dicyclopentadiene-based epoxy resins, biphenyl-based epoxy resins, alicyclic epoxy resins, polyol-based epoxy resins, phosphorus-containing epoxy resins, glycidyl amines, glycidyl esters, compounds obtained by epoxidizing double bonds of butadiene and the like, and compounds obtained by reaction of hydroxyl group-containing silicone resins and epichlorohydrin. Among these epoxy resins, biphenyl aralkyl-based epoxy resins, naphthylene ether-based epoxy resins, polyfunctional phenol-based epoxy resins, and naphthalene-based epoxy resins are preferred in terms of flame retardancy and heat resistance. One of these epoxy resins can be used alone, or two or more of these epoxy resins can be used in combination.

(Maleimide Compound)

As the maleimide compound, those generally known can be used as long as they are compounds having one or more maleimide groups in one molecule. Examples include 4,4-diphenylmethanebismaleimide, phenylmethanemaleimide, m-phenylenebismaleimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,6-bismaleimido-(2,2,4-trimethyl)hexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, polyphenylmethanemaleimide, novolac-based maleimides, biphenyl aralkyl-based maleimides, and prepolymers of these maleimide compounds or prepolymers of maleimide compounds and amine compounds but are not particularly limited. One of these maleimide compounds can be used, or two or more of these maleimide compounds can be mixed and used. Among these, novolac-based maleimide compounds and biphenyl aralkyl-based maleimide compounds are particularly preferred.

(Phenolic Resin)

As the phenolic resin, those generally known can be used as long as they are phenolic resins having two or more hydroxyl groups in one molecule. Specific examples thereof include bisphenol A-based phenolic resins, bisphenol E-based phenolic resins, bisphenol F-based phenolic resins, bisphenol S-based phenolic resins, phenol novolac resins, bisphenol A novolac-based phenolic resins, glycidyl ester-based phenolic resins, aralkyl novolac-based phenolic resins, biphenyl aralkyl-based phenolic resins, cresol novolac-based phenolic resins, polyfunctional phenolic resins, naphthol resins, naphthol novolac resins, polyfunctional naphthol resins, anthracene-based phenolic resins, naphthalene skeleton-modified novolac-based phenolic resins, phenol aralkyl-based phenolic resins, naphthol aralkyl-based phenolic resins, dicyclopentadiene-based phenolic resins, biphenyl-based phenolic resins, alicyclic phenolic resins, polyol-based phenolic resins, phosphorus-containing phenolic resins, and hydroxyl group-containing silicone resins but are not particularly limited. Among these phenolic resins, biphenyl aralkyl-based phenolic resins, naphthol aralkyl-based phenolic resins, phosphorus-containing phenolic resins, and hydroxyl group-containing silicone resins are preferred in terms of flame retardancy. One of these phenolic resins can be used alone, or two or more of these phenolic resins can be used in combination.

(Oxetane Resin)

As the oxetane resin, those generally known can be used. Examples of the oxetane resin include oxetane, alkyloxetanes such as 2-methyloxetane, 2,2-dimethyloxetane, 3-methyloxetane, and 3,3-dimethyloxetane, 3-methyl-3-methoxymethyloxetane, 3,3-di(trifluoromethyl)perfluoroxetane, 2-chloromethyloxetane, 3,3-bis(chloromethyl)oxetane, biphenyl-based oxetane, OXT-101 (trade name manufactured by Toagosei Co., Ltd.), and OXT-121 (trade name manufactured by Toagosei Co., Ltd.) but are not particularly limited. One of these oxetane resins can be used alone, or two or more of these oxetane resins can be mixed and used.

(Benzoxazine Compound)

As the benzoxazine compound, those generally known can be used as long as they are compounds having two or more dihydrobenzoxazine rings in one molecule. Examples of the benzoxazine compound include bisphenol A-based benzoxazine BA-BXZ (trade name manufactured by Konishi Chemical Ind. Co., Ltd.) bisphenol F-based benzoxazine BF-BXZ (trade name manufactured by Konishi Chemical Ind. Co., Ltd.), bisphenol S-based benzoxazine BS-BXZ (trade name manufactured by Konishi Chemical Ind. Co., Ltd.), P-d-based benzoxazine (trade name manufactured by SHIKOKU CHEMICALS CORPORATION), and F-α-based benzoxazine (trade name manufactured by SHIKOKU CHEMICALS CORPORATION) but are not particularly limited. One of these benzoxazine compounds can be used alone, or two or more of these benzoxazine compounds can be mixed and used.

(Compound Having Polymerizable Unsaturated Group)

As the compound having a polymerizable unsaturated group, those generally known can be used. Examples of the compound having a polymerizable unsaturated group include vinyl compounds such as ethylene, propylene, styrene, divinylbenzene, and divinylbiphenyl; (meth)acrylates of monohydric or polyhydric alcohols such as methyl (meth)acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate; epoxy (meth)acrylates such as bisphenol A-based epoxy (meth)acrylate and bisphenol F-based epoxy (meth)acrylate; and benzocyclobutene resins; but are not particularly limited. One of these compounds having an unsaturated group can be used alone, or two or more of these compounds having an unsaturated group can be mixed and used. The above "(meth)acrylate" is a concept including acrylate and methacrylate corresponding to the acrylate.

(Curing Accelerator)

In addition, the resin composition in the present embodiment may contain a curing accelerator for appropriately adjusting the curing rate, as needed. As this curing accelerator, those generally used as curing accelerators for cyanate compounds, epoxy resins, and the like can be preferably used, and the type of the curing accelerator is not particularly limited. Specific examples of the curing accelerator include organometallic salts such as zinc octylate, zinc naphthenate, cobalt naphthenate, copper naphthenate, acetylacetone iron, nickel octylate, and manganese octylate, phenol compounds such as phenol, xylenol, cresol, resorcin, catechol, octyl phenol, and nonyl phenol, alcohols such as 1-butanol and 2-ethylhexanol, imidazoles such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole and derivatives such as adducts of carboxylic acids of these imidazoles or acid anhydrides thereof, amines such as dicyandiamide, benzyldimethylamine, and 4-methyl-N,N-dimethylbenzylamine, phosphorus compounds such as phosphine-based compounds, phosphine oxide-based compounds, phosphonium salt-based compounds, and diphosphine-based compounds, peroxides such as epoxy-imidazole adduct-based compounds, benzoyl peroxide, p-chlorobenzoyl peroxide, di-t-butyl peroxide, diisopropyl peroxycarbonate, and di-2-ethylhexyl peroxycarbonate, or azo compounds such as azobisisobutyronitrile. One of these curing accelerator can be used alone, or two or more of these curing accelerators can be used in combination.

The amount of the curing accelerator used can be appropriately adjusted considering the degrees of cure of the resins, the viscosity of the resin composition, and the like and is not particularly limited. The amount of the curing accelerator used may be 0.005 to 10 parts by mass based on 100 parts by mass of the resin solid component in the resin composition.

(Other Additives)

Further, various polymer compounds such as another thermosetting resin, a thermoplastic resin and an oligomer thereof, and an elastomer, a flame-retardant compound, various additives, and the like can be used in combination in the resin composition in the present embodiment in a range in which the expected characteristics are not impaired. These are not particularly limited as long as they are those generally used. Specific examples of the flame-retardant compound include, but not limited to, bromine compounds such as 4,4'-dibromobiphenyl, phosphates, melamine phosphate, phosphorus-containing epoxy resins, nitrogen compounds such as melamine and benzoguanamine, oxazine ring-containing compounds, and silicone-based compounds. In addition, examples of the various additives include, but not limited to, for example, ultraviolet absorbing agents, antioxidants, photopolymerization initiators, fluorescent brightening agents, photosensitizers, dyes, pigments, thickening agents, flow-adjusting agents, lubricants, defoaming agents, dispersing agents, leveling agents, brightening agents, and polymerization inhibitors. One of these can be used alone or two or more of these can be used in combination as desired.

(Organic Solvent)

The resin composition in the present embodiment can contain an organic solvent as needed. In this case, the resin composition in the present embodiment can be used as a form (solution or varnish) in which at least some, preferably all, of the above-described various resin components are dissolved in or compatible with the organic solvent. As the organic solvent, known ones can be appropriately used as long as they can dissolve or be compatible with at least some, preferably all, of the above-described various resin components. The type of the organic solvent is not particularly limited. Specific examples of the organic solvent include ketones such as acetone, methyl ethyl ketone, and methyl isobutyl ketone; cellosolve-based solvents such as propylene glycol monomethyl ether and propylene glycol monomethyl ether acetate; ester-based solvents such as ethyl lactate, methyl acetate, ethyl acetate, butyl acetate, isoamyl acetate, ethyl lactate, methyl methoxypropionate, and methyl hydroxyisobutyrate; and amides such as dimethylacetamide and dimethylformamide; and nonpolar solvents such as aromatic hydrocarbons such as toluene and xylene. One of these can be used alone, or two or more of these can be used in combination.

The resin composition in the present embodiment can be prepared according to an ordinary method, and the method for preparing the resin composition in the present embodiment is not particularly limited as long as it is a method in which a resin composition uniformly containing the epoxy resin (A) represented by formula (1) and the cyanate compound (B) and the above-described other optional components is obtained. For example, the resin composition in the present embodiment can be easily prepared by sequentially blending the epoxy resin (A) represented by formula (1) and the cyanate compound (B) with a solvent and sufficiently stirring the blend.

During preparation of the resin composition, known treatment (stirring, mixing, and kneading treatment and the like) for uniformly dissolving or dispersing the components can be performed. For example, in uniform dispersion of the filler (C), by performing stirring and dispersion treatment using a stirring vessel provided with a stirrer having suitable stirring ability, the dispersibility in the resin composition is increased. The above stirring, mixing, and kneading treatment can be appropriately performed, for example, using a known apparatus such as an apparatus intended for mixing such as a ball mill or a bead mill, or a revolution-rotation mixing apparatus.

The resin composition in the present embodiment can be used as constituent materials of a prepreg, a metal foil-clad laminate, a printed circuit board, and a semiconductor package. For example, a prepreg can be obtained by impregnating or coating a base material with a solution of the resin composition in the present embodiment dissolved in a solvent and drying the solution.

In addition, a buildup film or a dry film solder resist can be obtained by using a peelable plastic film as a base material, coating the plastic film with a solution of the resin composition in the present embodiment dissolved in a solvent, and drying the solution. Here, the solvent can be dried by drying at a temperature of 20° C. to 150° C. for 1 to 90 minutes.

In addition, the resin composition in the present embodiment can also be used in an uncured state in which the solvent is only dried, or in a semi-cured (B-staged) state as needed.

A prepreg in the present embodiment will be described in detail below. The prepreg in the present embodiment comprises a base material; and the above resin composition with which the base material is impregnated or coated. The method for producing the prepreg in the present embodiment is not particularly limited as long as it is a method of combining the resin composition in the present embodiment and a base material to produce a prepreg. Specifically, the prepreg in the present embodiment can be produced by impregnating or coating a base material with the resin composition in the present embodiment and then semi-curing the resin composition by a method of drying in a dryer at 120 to 220° C. for about 2 to 15 minutes, or the like. At this time, the amount of the resin composition adhered to the base material, that is, the content of the resin composition (including the filler (C)) based on the total amount of the prepreg after the semi-curing, is preferably in the range of 20 to 99% by mass.

The base material used when the prepreg in the present embodiment is produced may be a known one used for various printed circuit board materials. Examples of such a base material include, but are not particularly limited to, woven fabrics of fibers of glass such as E glass, D glass, L glass, S glass, T glass, Q glass, UN glass, NE glass, and spherical glass, inorganic fibers of materials other than glass, such as quartz, organic fibers of polyimides, polyamides, polyesters, and the like, liquid crystal polyesters, and the like. As the shape of the base material, woven fabrics, nonwoven fabrics, rovings, chopped strand mats, surfacing mats, and the like are known, and the shape of the base material may be any of these. One of these base materials can be used alone, or two or more of these base materials can be used in appropriate combination. Among woven fabrics, particularly, woven fabrics subjected to ultra-opening treatment or clogging treatment are preferred from the viewpoint of dimensional stability. Further, glass woven fabrics surface-treated with silane coupling agents for epoxysilane treatment, aminosilane treatment, or the like are preferred from the viewpoint of moisture absorption heat resistance. In addition, liquid crystal polyester woven fabrics are preferred in terms of electrical characteristics. Further, the thickness of the base material is not particularly limited, but is preferably in the range of 0.01 to 0.2 mm in laminate applications.

A metal foil-clad laminate in the present embodiment comprises at least one or more of the above-described prepregs laminated; and metal foil disposed on one surface or both surfaces of the prepreg. Specifically, the metal foil-clad laminate in the present embodiment can be fabricated by disposing foil of a metal such as copper or aluminum on one surface or both surfaces of one of the above-described prepreg or a stack of a plurality of the prepregs and laminate-molding the metal foil and the prepreg or the stack. The metal foil used here is not particularly limited as long as it is one used for a printed circuit board material. Copper foil such as rolled copper foil and electrolytic copper foil is preferred. In addition, the thickness of the metal foil is not particularly limited but is preferably 2 to 70 μm, more preferably 3 to 35 μm. As the molding conditions, methods used when usual laminates and multilayer boards for printed circuit boards are fabricated can be adopted. For example, the metal foil-clad laminate in the present embodiment can be produced by laminate-molding under the conditions of a temperature of 180 to 350° C., a heating time of 100 to 300 minutes, and a surface pressure of 20 to 100 kg/cm$^2$ using a multistage press, a multistage vacuum press, a continuous molding machine, an autoclave molding machine, or the like. In addition, a multilayer board can also be fabricated by laminate-molding the above prepreg and a separately fabricated wiring board for an inner layer in combination. As the method for producing a multilayer board, for example, 35 μm copper foil is disposed on both surfaces of one of the above-described prepreg, the copper foil and the prepreg are laminated and formed under the above conditions, then inner layer circuits are formed, and these circuits are subjected to blackening treatment to form an inner layer circuit board. Further, these inner layer circuit boards and the above prepregs are alternately disposed one by one, copper foil is further disposed on the outermost layers, and the copper foil, the inner layer circuit boards, and the prepregs are laminate-molded under the above conditions preferably under vacuum. Thus, a multilayer board can be fabricated.

The metal foil-clad laminate in the present embodiment can be preferably used as a printed circuit board by further forming a pattern. The printed circuit board can be produced according to an ordinary method, and the method for producing the printed circuit board is not particularly limited. One example of a method for producing a printed circuit board will be shown below. First, the above-described metal foil-clad laminate is provided. Next, the surfaces of the metal foil-clad laminate are subjected to etching treatment to form inner layer circuits to fabricate an inner layer board. The inner layer circuit surfaces of this inner layer board are subjected to surface treatment for increasing adhesive strength, as needed, and then the required number of the above-described prepregs are stacked on the inner layer circuit surfaces. Further, metal foil for outer layer circuits is laminated on the outside of the stack, and heat and pressure are applied for integral molding. In this manner, a multilayer laminate in which insulating layers comprising a base material and a cured product of a thermosetting resin composition are formed between inner layer circuits and metal foil for outer layer circuits is produced. Then, this multilayer laminate is subjected to perforation for through holes and via holes, and then plating metal films that allow conduction between the inner layer circuits and the metal foil for outer layer circuits are formed on the wall surfaces of these holes. Further, the metal foil for outer layer circuits is subjected to etching treatment to form outer layer circuits. Thus, a printed circuit board is produced.

The printed circuit board obtained in the above production example has a configuration in which it has insulating layers and conductor layers formed on surfaces of these insulating layers, and the insulating layers comprise the resin composition in the present embodiment described above. In other words, the prepreg in the present embodiment described above (the base material and the resin composition in the present embodiment with which the base material is impregnated or coated) and the resin composition layer of the metal foil-clad laminate in the present embodiment described above (the layer comprising the resin composition in the present embodiment) are composed of an insulating layer comprising the resin composition in the present embodiment.

A resin sheet in the present embodiment refers to a support and the above resin composition layer disposed on a surface of the support (laminated sheet) and also refers to only the resin composition layer obtained by removing the support (single-layer sheet). This laminated sheet can be obtained by coating a support with a solution of the above resin composition dissolved in a solvent and drying the solution. The support used here is not particularly limited. Examples thereof include organic film base materials such as polyethylene films, polypropylene films, polycarbonate films, polyethylene terephthalate films, ethylene-tetrafluoroethylene copolymer films, and release films obtained by coating surfaces of these films with release agents, and polyimide films, conductor foil such as copper foil and aluminum foil, and plate-shaped inorganic films such as glass plates, SUS plates, and FRP. Examples of the coating method include a method of fabricating a laminated sheet in which a support and a resin composition layer are integrated, by coating a support with a solution of the above resin composition dissolved in a solvent by a bar coater, a die coater, a doctor blade, a baker applicator, or the like. In addition, a single-layer sheet can also be obtained by peeling or etching the support from the resin sheet obtained by further drying after the coating. A single-layer sheet can also be obtained without using a support by supplying a solution of the above resin composition in the present embodiment dissolved in or made compatible with a solvent into a mold having a sheet-shaped cavity, and drying the solution, or the like for molding into a sheet shape.

In fabrication of the resin sheet or the single-layer sheet in the present embodiment, the drying conditions when the solvent is removed are not particularly limited, but drying is preferably performed at a temperature of 20° C. to 200° C. for 1 to 90 minutes. At 20° C. or more, remaining of the solvent in the resin composition can be more prevented, and at 200° C. or less, progress of curing of the resin composition can be suppressed. In addition, the thickness of the resin layer in the resin sheet or the single-layer sheet in the present embodiment can be adjusted by the concentration and coating thickness of the solution of the resin composition in the present embodiment and is not particularly limited. However, the thickness is preferably 0.1 to 500 μm. When the thickness of the resin layer is 500 μm or less, the solvent is even less likely to remain during drying.

EXAMPLES

The present embodiment will be more specifically described below using an Example and a Comparative Example. The present embodiment is not limited in any way by the following Example.

(Synthesis Example 1) Synthesis of Cyanate Compound 300 g (1.28 mol in terms of OH groups) of a 1-naphthol aralkyl resin (manufactured by NIPPON STEEL & SUMIKIN CHEMICAL CO., LTD.) and 194.6 g (1.92 mol) (1.5 mol based on 1 mol of hydroxy groups) of triethylamine were dissolved in 1800 g of dichloromethane, and this solution was a solution 1.

While 125.9 g (2.05 mol) (1.6 mol based on 1 mol of hydroxy groups) of cyanogen chloride, 293.8 g of dichloromethane, 194.5 g (1.92 mol) (1.5 mol based on 1 mol of hydroxy groups) of 36% hydrochloric acid, and 1205.9 g of water were kept at a liquid temperature of −2 to −0.5° C. under stirring, the solution 1 was poured over 30 minutes. After completion of pouring of the solution 1, the mixture was stirred at the same temperature for 30 minutes, and then a solution of 65 g (0.64 mol) (0.5 mol based on 1 mol of hydroxy groups) of triethylamine dissolved in 65 g of dichloromethane (solution 2) was poured over 10 minutes. After completion of pouring of the solution 2, the mixture was stirred at the same temperature for 30 minutes to complete the reaction.

Then, the reaction liquid was allowed to stand to separate the organic phase and the aqueous phase. The obtained organic phase was washed five times with 1300 g of water. The electrical conductivity of the wastewater from the fifth water washing was 5 μS/cm, and therefore it was confirmed that the ionic compounds were sufficiently removed by the washing with water.

The organic phase after the water washing was concentrated under reduced pressure and finally concentrated to dryness at 90° C. for 1 hour to obtain 331 g of the target naphthol aralkyl-based cyanate compound (SNCN) (orange viscous material). The mass average molecular weight Mw of the obtained SNCN was 600. In addition, the IR spectrum of SNCN showed absorption at 2250 cm$^{-1}$ (cyanate groups) and showed no absorption of hydroxy groups.

Example 1

50 parts by mass of the SNCN obtained by Synthesis Example 1, 50 parts by mass of an epoxy resin represented by the following formula (1-1) ("GK-3007-50D" manufactured by NIPPON STEEL & SUMIKIN CHEMICAL CO., LTD.), 100 parts by mass of fused silica (SC2050 MB, manufactured by Admatechs Company Limited), and 0.13 parts by mass of zinc octylate (manufactured by Nihon Kagaku Sangyo Co., Ltd.) were mixed to obtain a varnish. This varnish was diluted with methyl ethyl ketone, and an E-glass woven fabric having a thickness of 0.1 mm was impregnated and coated with the diluted varnish and heated and dried at 165° C. for 5 minutes to obtain a prepreg having a resin content of 50% by mass.

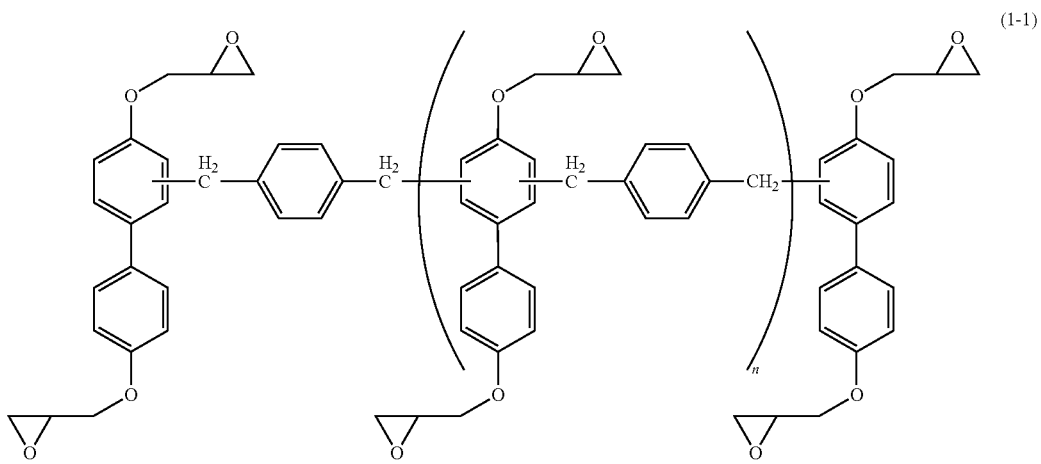

(1-1)

wherein n represents an integer of 0 to 15.

Eight and two of the obtained prepregs were stacked, and 12 μm thick electrolytic copper foil (3EC-M3-VLP, manufactured by MITSUI MINING & SMELTING CO., LTD.) was disposed on the tops and the bottoms. The stacks were laminate-molded at a pressure of 30 kgf/cm$^2$ and a temperature of 220° C. for 120 minutes to obtain metal foil-clad laminates having an insulating layer thickness of 0.8 mm. Evaluation of copper foil peel strength, flexural strength, a flexural modulus, a water absorption rate, linear thermal expansion coefficients, weight loss on heating, and thermal conductivity was performed using the obtained metal foil-clad laminates. The results are shown in Table 1.

Comparative Example 1

A prepreg having a resin content of 50% by mass was obtained as in Example 1 except that in Example 1, 50 parts by mass of a biphenyl aralkyl-based epoxy resin represented by the following formula (6) (NC-3000-FH, manufactured by Nippon Kayaku Co., Ltd.) was used instead of using 50 parts by mass of the epoxy resin represented by formula (1-1), and the amount of zinc octylate was 0.12 parts by mass. Further, metal foil-clad laminates having thicknesses of 0.8 mm and 0.2 mm were obtained. The evaluation results of the obtained metal foil-clad laminates are shown in Table 1.

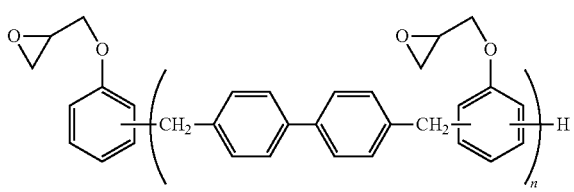

(6)

wherein n represents an integer of 0 to 15.

[Measurement Methods and Evaluation Methods]

(1) Copper Foil Peel Strength

The copper foil peel strength was measured three times in accordance with JIS C6481, Test methods of copper-clad laminates for printed circuit boards (see 5.7 Peel Strength), using a test piece (30 mm×150 mm×0.8 mm thick) of each of the copper-clad laminates having an insulating layer thickness of 0.8 mm obtained as described above, and the average value of the lower limit values was determined to be the measured value.

(2) Flexural Strength

The copper foil on both surfaces of each of the obtained metal foil-clad laminates having an insulating layer thickness of 0.8 mm was removed by etching. Then, the flexural strength was measured by an Autograph (AG-IS manufactured by SHIMADZU CORPORATION) apparatus at a temperature of 25° C. with a number of tests of 5 in accordance with JIS C6481 using a test piece (50 mm×25 mm×0.8 mm), and the average value of the maximum values was determined to be the measured value.

(3) Flexural Modulus

The copper foil on both surfaces of each of the obtained metal foil-clad laminates having an insulating layer thickness of 0.8 mm was removed by etching. Then, the flexural modulus was measured with a number of tests of 5 in accordance with JIS C6481 using a test piece (50 mm×25 mm×0.8 mm), and the average value of the maximum values was determined to be the measured value.

(4) Water Absorption Rate

The water absorption rate after treatment at 121° C. and 2 atmospheres by a pressure cooker tester (model PC-3 manufactured by HIRAYAMA MANUFACTURING CORPORATION) for 5 hours was measured in accordance with JIS C6481 using a 30 mm×30 mm sample of each of the obtained metal foil-clad laminates having an insulating layer thickness of 0.8 mm.

(5) Linear Thermal Expansion Coefficients

For each of the obtained metal foil-clad laminates having an insulating layer thickness of 0.8 mm, the thermal expansion coefficients in the longitudinal direction of the glass cloth and the thickness direction of the specimen were measured for the insulating layer of the laminate by the TMA method (Thermo-mechanical analysis) defined in JIS C 6481, and the values were obtained. Specifically, the copper foil on both surfaces of each of the metal foil-clad laminates obtained above was removed by etching, and then by a thermo-mechanical analysis apparatus (manufactured by TA Instruments), the temperature was increased by 10° C. per minute from 40° C. to 340° C., and the linear thermal expansion coefficients at 60° C. to 120° C. (ppm/K) were measured.

(6) Weight Loss on Heating

The copper foil of each of the obtained metal foil-clad laminates having an insulating layer thickness of 0.8 mm was removed by etching. Then, the temperature was increased from a start temperature of 300° C. at a temperature increase rate of 10° C./min by a differential thermal-thermogravimetric simultaneous measurement apparatus TG/DTA6200 (manufactured by SII NanoTechnology Inc.) with a test piece of 3 mm×3 mm×0.8 mm under a nitrogen flow in accordance with JIS K7120-1987, and the weight loss on heating (amounts of thermal decomposition (%)) at points in time when 450° C. and 500° C. were reached at this time were obtained based on the following formula:

weight loss on heating $(\%) = (I-J)/I \times 100$ ($I$ represents the weight at the start temperature, and $J$ represents the weight at 450° C. or 500° C.)

(7) Thermal Conductivity

The density of each of the obtained metal foil-clad laminates having an insulating layer thickness of 0.8 mm was measured, and the specific heat was measured by a DSC (TA Instruments model Q100), and further the thermal diffusivity was measured by a xenon flash analyzer (Bruker: LFA447 Nanoflash). Then, the thermal conductivity in the thickness direction was calculated from the following formula:

thermal conductivity (W/m·K)=density (kg/m³)×specific heat (kJ/kg·K)×thermal diffusivity (m²/S)× 1000

TABLE 1

| Characteristics | | Comparative Example 1 | Example 1 |
|---|---|---|---|
| Copper foil peel strength | [kg/cm] | 0.89 | 0.95 |
| Flexural strength | [MPa] | 474 | 517 |
| Flexural modulus | [GPa] | 28 | 33 |
| Water absorption rate | [wt %] | 0.251 | 0.222 |
| Linear thermal expansion coefficients | CTE-x α 1 [ppm/K] | 10.6 | 10.4 |
| | CTE-y α 1 [ppm/K] | 12.7 | 10.9 |
| | CTE-z α 1 [ppm/K] | 26.3 | 22.9 |
| Weight decrease rates during heating | 1% weight decrease temperature [° C.] | 373 | 372 |
| | Weight decrease rate at 450° C. [%] | 7.9 | 7.4 |
| | Weight decrease rate at 500° C. [%] | 10.5 | 9.2 |
| Thermal conductivity | (W/m · K) – z | 0.65 | 0.73 |

This application is based on Japanese Patent Application No. 2016-177833 filed on Sep. 12, 2016, the contents of which are incorporated herein by reference.

The invention claimed is:
1. A resin composition comprising:
an epoxy resin (A) represented by the following formula (1-1); and
a cyanate compound (B),

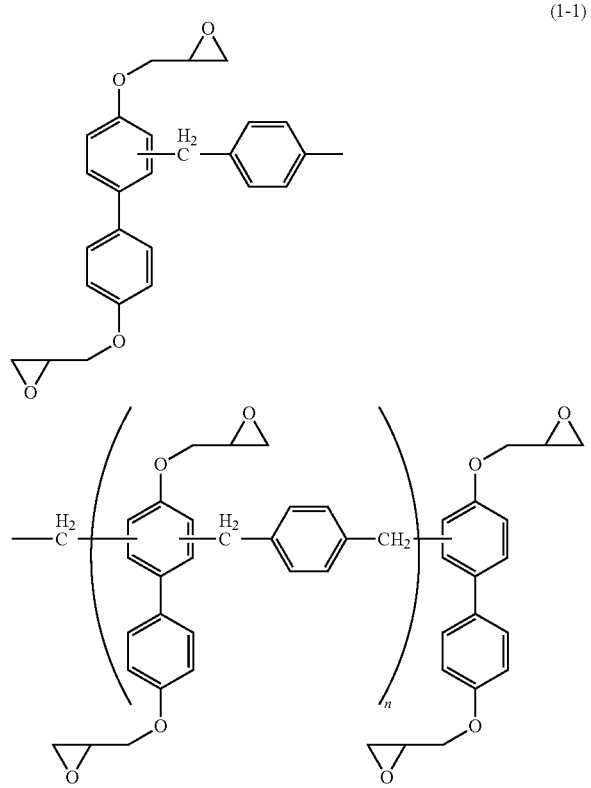

(1-1)

wherein n represents an integer of 0 to 15.

2. The resin composition according to claim 1, wherein a content of the epoxy resin (A) is 1 to 90 parts by mass based on 100 parts by mass of a resin solid component.

3. The resin composition according to claim 2, further comprising a filler (C).

4. The resin composition according to claim 3, wherein a content of the filler (C) is 50 to 1600 parts by mass based on 100 parts by mass of the resin solid component.

5. The resin composition according to claim 2, further comprising one or more selected from a group consisting of an epoxy resin other than the epoxy resin (A) represented by the formula (1-1), a maleimide compound, a phenolic resin, an oxetane resin, a benzoxazine compound, and a compound having a polymerizable unsaturated group.

6. The resin composition according to claim 1, further comprising a filler (C).

7. The resin composition according to claim 6, wherein a content of the filler (C) is 50 to 1600 parts by mass based on 100 parts by mass of the resin solid component.

8. The resin composition according to claim 6, further comprising one or more selected from a group consisting of an epoxy resin other than the epoxy resin (A) represented by the formula (1-1), a maleimide compound, a phenolic resin, an oxetane resin, a benzoxazine compound, and a compound having a polymerizable unsaturated group.

9. A prepreg comprising:
a base material; and
the resin composition according to claim 6, with which the base material is impregnated or coated.

10. A metal foil-clad laminate comprising:
at least one or more of the prepregs according to claim 9 laminated; and
a metal foil disposed on one surface or both surfaces of the prepreg.

11. A resin sheet comprising:
a support; and
the resin composition according to claim 6, disposed on a surface of the support.

12. The resin composition according to claim 1, further comprising one or more selected from a group consisting of an epoxy resin other than the epoxy resin (A) represented by the formula (1-1), a maleimide compound, a phenolic resin, an oxetane resin, a benzoxazine compound, and a compound having a polymerizable unsaturated group.

13. A prepreg comprising:
a base material; and
the resin composition according to claim 12, with which the base material is impregnated or coated.

14. A metal foil-clad laminate comprising:
at least one or more of the prepregs according to claim 13 laminated; and
a metal foil disposed on one surface or both surfaces of the prepreg.

15. A resin sheet comprising:
a support; and
the resin composition according to claim 12, disposed on a surface of the support.

16. A prepreg comprising:
a base material; and
the resin composition according to claim 1, with which the base material is impregnated or coated.

17. A metal foil-clad laminate comprising:
at least one or more of the prepregs according to claim 16 laminated; and
a metal foil disposed on one surface or both surfaces of the prepreg.

18. A resin sheet comprising:
a support; and
the resin composition according to claim 1, disposed on a surface of the support.

19. A printed circuit board comprising:
an insulating layer; and
a conductor layer formed on a surface of the insulating layer, wherein the insulating layer comprises the resin composition according to claim 1.

* * * * *